United States Patent
Tsukamoto

(10) Patent No.: US 7,887,163 B2
(45) Date of Patent: Feb. 15, 2011

(54) PIEZOELECTRIC ACTUATOR, LIQUID EJECTION HEAD, IMAGE FORMING APPARATUS, AND METHOD OF MANUFACTURING PIEZOELECTRIC ACTUATOR

(75) Inventor: Ryuji Tsukamoto, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 325 days.

(21) Appl. No.: 12/047,091

(22) Filed: Mar. 12, 2008

(65) Prior Publication Data
US 2008/0225089 A1    Sep. 18, 2008

(30) Foreign Application Priority Data
Mar. 13, 2007    (JP)    ............... 2007-063692

(51) Int. Cl.
*B41J 2/045*    (2006.01)
(52) U.S. Cl. ............... 347/68; 347/70; 347/71; 347/72
(58) Field of Classification Search .......... 347/68, 347/70–72
See application file for complete search history.

(56) References Cited

U.S. PATENT DOCUMENTS 6,347,862 B1    2/2002    Kanno et al.
2003/0234835 A1    12/2003    Torii et al.
2005/0258719 A1    11/2005    Sugahara et al.
2006/0213051 A1 *    9/2006    Sugahara ............... 29/592.1

FOREIGN PATENT DOCUMENTS

| JP | 10-286953 A | 10/1998 |
| JP | 2004-79991 A | 3/2004 |
| JP | 2006-6096 A | 1/2006 |

* cited by examiner

*Primary Examiner*—Charlie Peng
*Assistant Examiner*—Hung Lam
(74) *Attorney, Agent, or Firm*—Birch, Stewart, Kolasch & Birch, LLP

(57) ABSTRACT

The piezoelectric actuator has: a diaphragm made of silicon; an insulating layer formed on a front surface of the diaphragm; a plurality of individual electrodes formed on a surface of the insulating layer; a plurality of piezoelectric bodies formed respectively on surfaces of the plurality of individual electrodes; and a plurality of common electrodes which are respectively arranged across the plurality of piezoelectric bodies from the plurality of individual electrodes, wherein the plurality of piezoelectric bodies are polarized in a direction from the individual electrodes toward the plurality of common electrodes.

4 Claims, 12 Drawing Sheets

FIG.3

THICKNESS OF DIAPHRAGM, C : 6 [μm]

| THICKNESS OF INSULATING LAYER A[μm] | THICKNESS OF ETCHING STOP LAYER B[μm] | LEAKAGE CURRENT | OVER-ETCHING | COST | DEFORMATION OF DIAPHRAGM | COMPREHENSIVE EVALUATION |
|---|---|---|---|---|---|---|
| 0.2 | 0.2 | NG | NG | OK | OK | NG |
| | 0.5 | NG | OK | OK | OK | NG |
| | 1 | NG | OK | OK | OK | NG |
| | 2 | NG | OK | OK | OK | NG |
| | 3 | NG | OK | NG | NG | NG |
| 0.5 | 0.2 | OK | NG | OK | OK | NG |
| | 0.5 | OK | OK | OK | OK | OK |
| | 1 | OK | OK | OK | OK | OK |
| | 2 | OK | OK | OK | OK | OK |
| | 3 | OK | OK | NG | NG | NG |
| 1 | 0.2 | OK | NG | OK | OK | NG |
| | 0.5 | OK | OK | OK | OK | OK |
| | 1 | OK | OK | OK | OK | OK |
| | 2 | OK | OK | OK | OK | OK |
| | 3 | OK | OK | NG | NG | NG |
| 2 | 0.2 | OK | NG | OK | OK | NG |
| | 0.5 | OK | OK | OK | OK | OK |
| | 1 | OK | OK | OK | OK | OK |
| | 2 | OK | OK | OK | OK | OK |
| | 3 | OK | OK | NG | NG | NG |
| 3 | 0.2 | OK | NG | OK | NG | NG |
| | 0.5 | OK | OK | OK | NG | NG |
| | 1 | OK | OK | OK | NG | NG |
| | 2 | OK | OK | OK | NG | NG |
| | 3 | OK | OK | NG | OK | NG |

FIG.4

THICKNESS OF DIAPHRAGM, C :1[μm]

| THICKNESS OF INSULATING LAYER A[μm] | THICKNESS OF ETCHING STOP LAYER B[μm] | LEAKAGE CURRENT | OVER-ETCHING | COST | DEFORMATION OF DIAPHRAGM | COMPREHENSIVE EVALUATION |
|---|---|---|---|---|---|---|
| 0.2 | 0.2 | NG | NG | OK | NG | NG |
|  | 0.5 | NG | OK | OK | NG | NG |
|  | 1 | NG | OK | OK | NG | NG |
|  | 2 | NG | OK | OK | NG | NG |
|  | 3 | NG | OK | NG | NG | NG |
| 0.5 | 0.2 | OK | NG | OK | NG | NG |
|  | 0.5 | OK | OK | OK | NG | NG |
|  | 1 | OK | OK | OK | NG | NG |
|  | 2 | OK | OK | OK | NG | NG |
|  | 3 | OK | OK | NG | NG | NG |
| 1 | 0.2 | OK | NG | OK | NG | NG |
|  | 0.5 | OK | OK | OK | NG | NG |
|  | 1 | OK | OK | OK | NG | NG |
|  | 2 | OK | OK | OK | NG | NG |
|  | 3 | OK | OK | NG | NG | NG |
| 2 | 0.2 | OK | NG | OK | NG | NG |
|  | 0.5 | OK | OK | OK | NG | NG |
|  | 1 | OK | OK | OK | NG | NG |
|  | 2 | OK | OK | OK | NG | NG |
|  | 3 | OK | OK | NG | NG | NG |
| 3 | 0.2 | OK | NG | OK | NG | NG |
|  | 0.5 | OK | OK | OK | NG | NG |
|  | 1 | OK | OK | OK | NG | NG |
|  | 2 | OK | OK | OK | NG | NG |
|  | 3 | OK | OK | NG | NG | NG |

FIG.5

THICKNESS OF DIAPHRAGM, C :2[μm]

| THICKNESS OF INSULATING LAYER A[μm] | THICKNESS OF ETCHING STOP LAYER B[μm] | LEAKAGE CURRENT | OVER-ETCHING | COST | DEFORMATION OF DIAPHRAGM | COMPREHENSIVE EVALUATION |
|---|---|---|---|---|---|---|
| 0.2 | 0.2 | NG | NG | OK | OK | NG |
| | 0.5 | NG | OK | OK | OK | NG |
| | 1 | NG | OK | OK | OK | NG |
| | 2 | NG | OK | OK | OK | NG |
| | 3 | NG | OK | NG | NG | NG |
| 0.5 | 0.2 | OK | NG | OK | OK | NG |
| | 0.5 | OK | OK | OK | OK | OK |
| | 1 | OK | OK | OK | OK | OK |
| | 2 | OK | OK | OK | OK | OK |
| | 3 | OK | OK | NG | NG | NG |
| 1 | 0.2 | OK | NG | OK | OK | NG |
| | 0.5 | OK | OK | OK | OK | OK |
| | 1 | OK | OK | OK | OK | OK |
| | 2 | OK | OK | OK | OK | OK |
| | 3 | OK | OK | NG | NG | NG |
| 2 | 0.2 | OK | NG | OK | OK | NG |
| | 0.5 | OK | OK | OK | OK | OK |
| | 1 | OK | OK | OK | OK | OK |
| | 2 | OK | OK | OK | OK | OK |
| | 3 | OK | OK | NG | NG | NG |
| 3 | 0.2 | OK | NG | OK | NG | NG |
| | 0.5 | OK | OK | OK | NG | NG |
| | 1 | OK | OK | OK | NG | NG |
| | 2 | OK | OK | OK | NG | NG |
| | 3 | OK | OK | NG | OK | NG |

FIG.6

THICKNESS OF DIAPHRAGM, C :15[μm]

| THICKNESS OF INSULATING LAYER A[μm] | THICKNESS OF ETCHING STOP LAYER B[μm] | LEAKAGE CURRENT | OVER-ETCHING | COST | DEFORMATION OF DIAPHRAGM | COMPREHENSIVE EVALUATION |
|---|---|---|---|---|---|---|
| 0.2 | 0.2 | NG | NG | OK | OK | NG |
|  | 0.5 | NG | OK | OK | OK | NG |
|  | 1 | NG | OK | OK | OK | NG |
|  | 2 | NG | OK | OK | OK | NG |
|  | 3 | NG | OK | NG | NG | NG |
| 0.5 | 0.2 | OK | NG | OK | OK | NG |
|  | 0.5 | OK | OK | OK | OK | OK |
|  | 1 | OK | OK | OK | OK | OK |
|  | 2 | OK | OK | OK | OK | OK |
|  | 3 | OK | OK | NG | NG | NG |
| 1 | 0.2 | OK | NG | OK | OK | NG |
|  | 0.5 | OK | OK | OK | OK | OK |
|  | 1 | OK | OK | OK | OK | OK |
|  | 2 | OK | OK | OK | OK | OK |
|  | 3 | OK | OK | NG | NG | NG |
| 2 | 0.2 | OK | NG | OK | OK | NG |
|  | 0.5 | OK | OK | OK | OK | OK |
|  | 1 | OK | OK | OK | OK | OK |
|  | 2 | OK | OK | OK | OK | OK |
|  | 3 | OK | OK | NG | NG | NG |
| 3 | 0.2 | OK | NG | OK | NG | NG |
|  | 0.5 | OK | OK | OK | NG | NG |
|  | 1 | OK | OK | OK | NG | NG |
|  | 2 | OK | OK | OK | NG | NG |
|  | 3 | OK | OK | NG | OK | NG |

FIG.7

THICKNESS OF DIAPHRAGM, C :20[μm]

| THICKNESS OF INSULATING LAYER A[μm] | THICKNESS OF ETCHING STOP LAYER B[μm] | LEAKAGE CURRENT | OVER-ETCHING | COST | DEFORMATION OF DIAPHRAGM | COMPREHENSIVE EVALUATION |
|---|---|---|---|---|---|---|
| 0.2 | 0.2 | NG | NG | OK | OK | NG |
|  | 0.5 | NG | OK | OK | OK | NG |
|  | 1 | NG | OK | OK | OK | NG |
|  | 2 | NG | OK | OK | OK | NG |
|  | 3 | NG | OK | NG | NG | NG |
| 0.5 | 0.2 | OK | NG | OK | OK | NG |
|  | 0.5 | OK | OK | OK | OK | OK |
|  | 1 | OK | OK | OK | OK | OK |
|  | 2 | OK | OK | OK | OK | OK |
|  | 3 | OK | OK | NG | NG | NG |
| 1 | 0.2 | OK | NG | OK | OK | NG |
|  | 0.5 | OK | OK | OK | OK | OK |
|  | 1 | OK | OK | OK | OK | OK |
|  | 2 | OK | OK | OK | OK | OK |
|  | 3 | OK | OK | NG | NG | NG |
| 2 | 0.2 | OK | NG | OK | OK | NG |
|  | 0.5 | OK | OK | OK | OK | OK |
|  | 1 | OK | OK | OK | OK | OK |
|  | 2 | OK | OK | OK | OK | OK |
|  | 3 | OK | OK | NG | NG | NG |
| 3 | 0.2 | OK | NG | OK | NG | NG |
|  | 0.5 | OK | OK | OK | NG | NG |
|  | 1 | OK | OK | OK | NG | NG |
|  | 2 | OK | OK | OK | NG | NG |
|  | 3 | OK | OK | NG | OK | NG |

PIEZOELECTRIC ACTUATOR, LIQUID EJECTION HEAD, IMAGE FORMING APPARATUS, AND METHOD OF MANUFACTURING PIEZOELECTRIC ACTUATOR

BACKGROUND OF THE INVENTION

1. Field of the Invention

The present invention relates to a piezoelectric actuator, a liquid ejection head, an image forming apparatus, and a method of manufacturing a piezoelectric actuator, and more particularly, to a piezoelectric actuator comprising a piezoelectric body formed by a sputtering method.

2. Description of the Related Art

A piezoelectric actuator used in an inkjet head, or the like, is constituted, for example, by a diaphragm made of silicon (silicon substrate), a lower electrode formed on the upper surface of the diaphragm, a piezoelectric body (PZT film) formed on the upper surface of the lower electrode, and an upper electrode formed on the upper surface of the piezoelectric body. In an inkjet head which comprises a piezoelectric actuator of this kind, when an electric field is applied to the piezoelectric body which is sandwiched between the electrodes, the piezoelectric body deforms and the ink inside the pressure chamber is pressurized by the diaphragm, thereby causing an ink droplet to be ejected from a nozzle.

In a general piezoelectric actuator, it is possible to obtain the same amount of displacement regardless of the direction of the electric field applied to the piezoelectric body (in other words, whatever the direction in which the electric field is applied). Consequently, from the viewpoint of reducing costs and facilitating the wiring tasks in the drive IC (driver IC) which supplies a drive voltage to the piezoelectric actuator, it is common to adopt a composition which uses the lower electrode which is disposed on the diaphragm side (pressure chamber side) of the piezoelectric body as a common electrode (ground electrode) and uses the upper electrode which is disposed on the opposite side as the individual electrode (address electrode).

However, for example, Japanese Patent Application Publication No. 2004-79991 discloses a piezoelectric actuator which comprises a piezoelectric body (PZT film: lead zirconium titanate film) deposited by sputtering. In such a piezoelectric body, the piezoelectric body already has an established orientation direction (direction of polarization) when the film of piezoelectric body is deposited, and there is a difference in the amount of displacement depending on the orientation of the applied electric field. For example, FIG. 12 shows the relationship between the applied electric field and the displacement in the case of a PZT film deposited by sputtering. As shown in FIG. 12, when an electric field is applied in the same direction as the direction of polarization, then it is possible to obtain a positive amount of displacement which is directly proportional to the intensity of the electric field. On the other hand, if an electric field is applied in the opposite direction to the direction of polarization, then a negative amount of displacement which is directly proportional to the intensity of the electric field is obtained if the absolute value of the electric field intensity is small, but as the absolute value of the electric field intensity becomes larger, the amount of displacement changes from negative to positive. Therefore, in a piezoelectric actuator which comprises a piezoelectric body deposited by sputtering as described above, a desirable composition is one where the lower electrode is used as an individual electrode (address electrode) and the upper electrode is used as a common electrode (ground electrode), in order that an electric field is applied to the piezoelectric body in the same direction as the direction of orientation (direction of polarization) of the piezoelectric film. This is because, if the upper electrode is used as an individual electrode, then a negative voltage must be supplied to the upper electrode, and the costs relating to the driver IC and power source become several times greater than when a positive voltage is supplied.

Furthermore, if the diaphragm is constituted by a silicon substrate and the lower electrode is used as an individual electrode while the upper electrode is used as a common electrode, then a current leakage occurs between the plurality of lower electrodes (individual electrodes) via the diaphragm, and a problem of electrical cross-talk arises, which causes ink droplets to be ejected from nozzles where they are not supposed to be ejected, for example. Moreover, due to the increase in the electrostatic capacitance, there is also a drawback in that the power consumption increases.

On the other hand, in the piezoelectric actuator disclosed in Japanese Patent Application Publication No. 2006-6096, an insulating layer is disposed between the diaphragm and the lower electrode (individual electrode). However, in Japanese Patent Application Publication No. 2006-6096, the composition described above is used only in order to suppress the occurrence of wiring faults by eliminating step-differences in the wires, and it does not consider reversing the direction of polarization of the piezoelectric bodies deposited by sputtering. Therefore, it is difficult to resolve the problems of electrical cross-talk and increase in power consumption.

On the other hand, Japanese Patent Application Publication No. 10-286953 discloses a method of manufacturing an inkjet head by forming an electrode and a piezoelectric film on a substrate of monocrystalline magnesium oxide (MgO), and then depositing a thin film thereon to form a diaphragm, the resulting structure then being transfer (bonded) to pressure chambers formed in a silicon substrate or glass substrate. However, in a method of this kind, costs are high due to the use of magnesium oxide, and furthermore, it is difficult to align the piezoelectric bodies and the pressure chambers accurately in position, due to the fact that a transfer bonding method is used.

SUMMARY OF THE INVENTION

The present invention has been contrived in view of these circumstances, an object thereof being to provide a piezoelectric actuator, a liquid ejection head, an image forming apparatus and a method of manufacturing a piezoelectric actuator, whereby electrical cross-talk and increase in power consumption can be prevented.

In order to attain an object described above, one aspect of the invention relates to a piezoelectric actuator, comprising: a diaphragm made of silicon; an insulating layer formed on a front surface of the diaphragm; a plurality of individual electrodes formed on a surface of the insulating layer; a plurality of piezoelectric bodies formed respectively on surfaces of the plurality of individual electrodes; and a plurality of common electrodes which are respectively arranged across the plurality of piezoelectric bodies from the plurality of individual electrodes, wherein the plurality of piezoelectric bodies are polarized in a direction from the individual electrodes toward the plurality of common electrodes.

In this aspect of the invention, since the insulating layer is disposed between the diaphragm and the individual electrodes, it is possible to suppress current leakage between the plurality of individual electrodes, and electrical cross-talk and increase in power consumption can be prevented.

Desirably, the insulating layer is made of one of a silicon oxide film, a silicon carbonitride film, a zirconium oxide film, and a silicon oxynitride film.

In this aspect of the invention, it is desirable that the insulating layer should be made of one of a silicon oxide film, a silicon carbonitride film, a zirconium oxide film, and a silicon oxynitride film, and it is possible effectively to suppress current leakage between the plurality of individual electrodes.

Desirably, the insulating layer formed on the front surface of the diaphragm is a first silicon oxide film; a second silicon oxide film is formed on a rear surface of the diaphragm; and taking a thickness of the first silicon oxide film to be A ($\mu$m), taking a thickness of the second silicon oxide film to be B ($\mu$m), and taking a thickness of the diaphragm to be C ($\mu$m), all of following conditions are satisfied: $0.2 \leq A \leq 5$, $0.2 \leq B \leq 5$, $0.2 \leq (B/A) \leq 5$ and $2 \leq C \leq 20$.

In this aspect of the invention, it is possible to prevent electrical cross-talk and increase in power consumption, as well as preventing initial bending (internal stress) of the diaphragm, and it is possible to prevent decline in the amount of displacement of the piezoelectric actuators.

Another aspect of the invention relates to a liquid ejection head comprising any one of the above-described piezoelectric actuators.

In this aspect of the invention, since piezoelectric actuators which prevent electrical cross-talk and increase in the power consumption are provided, then the ejection stability and ejection efficiency of the liquid ejection head are improved.

Another aspect of the invention relates to an image forming apparatus comprising the above-described liquid ejection head.

In this aspect of the invention, it is possible to improve the image quality.

Another aspect of the invention relates to a method of manufacturing a piezoelectric actuator, comprising the steps of: forming an insulating layer on a front surface of a diaphragm made of silicon; forming a plurality of individual electrodes on a surface of the insulating layer, forming a plurality of piezoelectric bodies by sputtering on surfaces of the plurality of individual electrodes; and forming a plurality of common electrodes which are respectively arranged across the plurality of piezoelectric bodies from the plurality of individual electrodes.

In this aspect of the invention, it is possible to manufacture a piezoelectric actuator which prevents electrical cross-talk and increased power consumption.

According to the present invention, since an insulating layer is disposed between a diaphragm and individual electrodes, it is possible to suppress current leakage between the individual electrodes, and electrical cross-talk and increase in power consumption can be prevented.

BRIEF DESCRIPTION OF THE DRAWINGS

The nature of this invention, as well as other objects and benefits thereof will be explained in the following with reference to the accompanying drawings, in which like reference characters designate the same or similar parts throughout the figures and wherein:

FIG. 3 is a diagram showing evaluation test results when the thickness of the diaphragm is 6 $\mu$m;

FIG. 4 is a diagram showing evaluation test results when the thickness of the diaphragm is 1 $\mu$m;

FIG. 5 is a diagram showing evaluation test results when the thickness of the diaphragm is 2 $\mu$m;

FIG. 6 is a diagram showing evaluation test results when the thickness of the diaphragm is 15 $\mu$m;

FIG. 7 is a diagram showing evaluation test results when the thickness of the diaphragm is 20 $\mu$m;

DETAILED DESCRIPTION OF THE PREFERRED EMBODIMENTS

Inkjet Head

Firstly, the composition of an inkjet head comprising a piezoelectric actuator to which an embodiment of the present invention is applied (which corresponds to the liquid ejection head according to the present invention) will be described.

Figure 1:
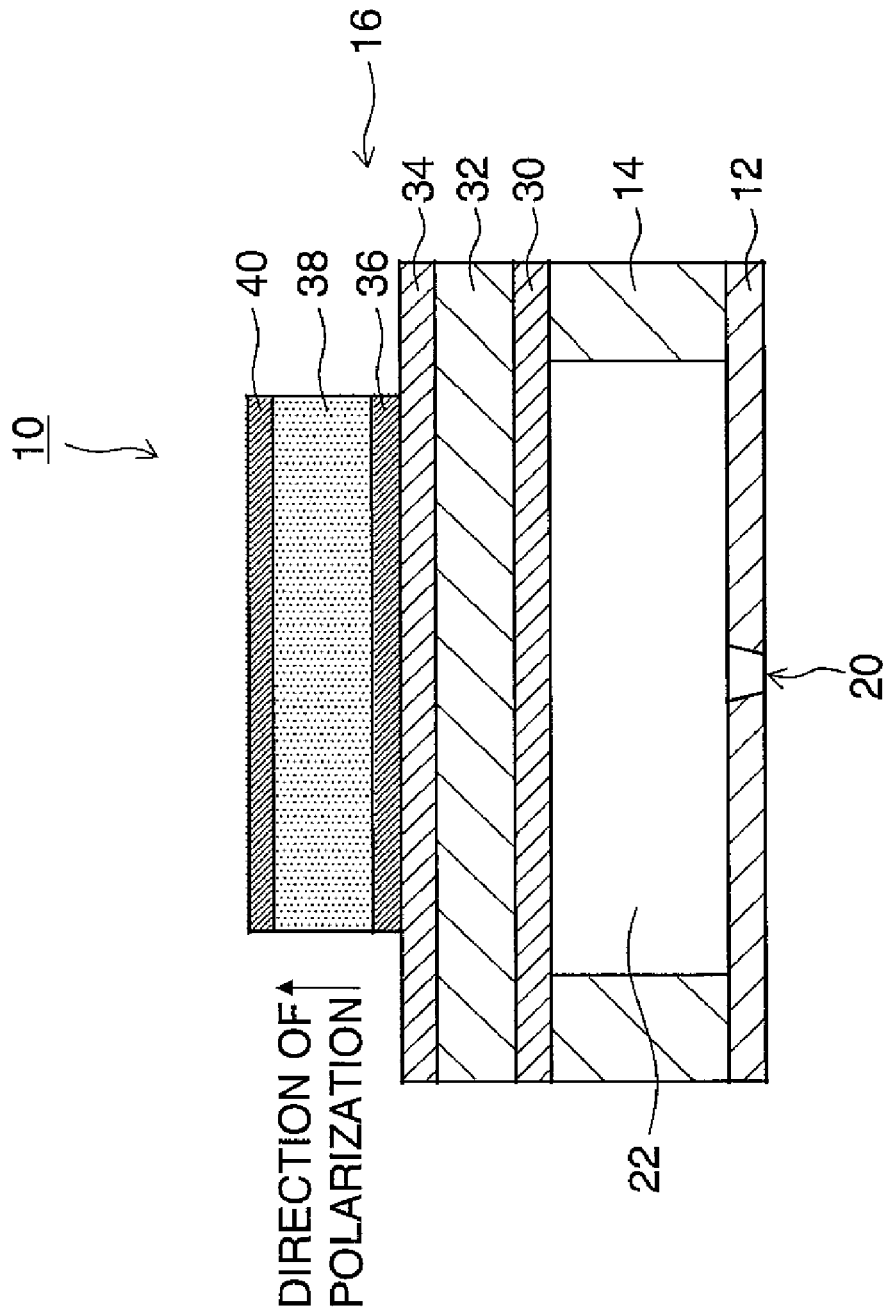
FIG. 1 is a cross-sectional diagram showing the principal composition of an inkjet head according to an embodiment of the invention.

FIG. 1 is a cross-sectional diagram showing the principal composition of an inkjet head according to the present embodiment. As shown in FIG. 1, the inkjet head 10 according to the present embodiment comprises a nozzle plate 12, a flow channel forming substrate 14 and a piezoelectric actuator 16. The nozzle plate 12 is bonded to the lower face of the flow channel forming substrate 14, and a piezoelectric actuator 16 is formed on the upper surface of the flow channel forming substrate 14.

The nozzle plate 12 may be made of a metal material, such as stainless steel or nickel, for example, or it may be made of a non-metallic material, such as polyimide. In implementing the present embodiment, there are no particular restrictions on the constituent material of the nozzle plate 12.

Nozzles (nozzle holes) 20 which are to become ink ejection ports are formed in the nozzle plate 12. In the example shown in FIG. 1, the shape of the nozzle hole 20 is a tapered shape which narrows toward the ink ejection side (the lower side in FIG. 1). In implementing the present embodiment, there are no particular restrictions on the shape of the nozzle holes 20, and the nozzle holes 20 may have a straight shape or a trumpet shape, for example. Although not shown in the drawings, the plurality of nozzle holes 20 are provided in the nozzle plate 12 in a two-dimensional configuration.

The flow channel forming substrate 14 is made of a silicon substrate and is formed with a plurality of pressure chambers 22. The side walls of the pressure chambers 22 are constituted by the flow channel forming substrate 14, and furthermore, the lower surface of the pressure chambers 22 is constituted by the nozzle plate 12, and the upper surface of the pressure chambers 22 is constituted by the etching stop layer 30 of the piezoelectric actuator 16.

The pressure chambers 22 are respectively provided so as to correspond to the nozzle holes 20 in the nozzle plate 12, and the pressure chambers 22 and the corresponding nozzle holes 20 are respectively connected to each other.

The pressure chambers 22 which are composed in this way are spaces into which ink is filled to be ejected from the nozzles 20. A common flow channel (not illustrated) which connects to a plurality of pressure chambers 22 is provided in the inkjet head 10, and the ink is distributed and supplied to each of the pressure chambers 22 from this common flow channel.

The piezoelectric actuator 16 comprises an etching stop layer 30, a diaphragm 32, an insulating layer 34, a lower electrode 36, a piezoelectric body 38 and an upper electrode 40. The etching stop layer 30, the diaphragm 32 and the insulating layer 34 are formed over a region spanning a plurality of pressure chambers 22, whereas the lower electrodes 36, the piezoelectric bodies 38 and the upper electrodes 40 are formed respectively at positions which correspond respectively to the plurality of pressure chambers 22.

The diaphragm 32 is made of a silicon substrate, and a silicon oxide film ($SiO_2$ film) is formed on each of the upper surface and the lower surface (front and rear surfaces) of the diaphragm 32. The silicon oxide film (first silicon oxide film) disposed on the upper surface (front surface) of the diaphragm 32 is an insulating layer 34, and the silicon oxide film (second silicon oxide film) disposed on the lower surface (rear surface) of the diaphragm 32 is the etching stop layer 30.

Each of the piezoelectric bodies 38 sandwiched between the lower electrodes 36 and the upper electrodes 40 is disposed on the upper surface side (front surface side) of the diaphragm 32, via the insulating layer 34, at each of the positions corresponding to the pressure chambers 22.

Each piezoelectric body 38 is a PZT film deposited by sputtering, and as shown in FIG. 1, it is oriented (polarized) preferentially in the direction from the lower electrode 36 toward the upper electrode 40. The lower electrode 36 and the upper electrode 40 are made of iridium (Ir), and the lower electrode 36 serves as an individual electrode (address electrode) while the upper electrode 40 serves as a common electrode (ground electrode).

In implementing the present embodiment, the piezoelectric material which constitutes the piezoelectric body 38 is not limited to lead zirconate titanate (PZT) and it is also possible to use another piezoelectric material, such as barium titanate, for example. Furthermore, there are no particular restrictions on the electrode material which constitutes the lower electrode 36 and the upper electrode 40, and it is possible to use platinum (Pt), tungsten (W), gold (Au), silver (Ag), copper (Cu), titanium (Ti), and the like.

For a piezoelectric actuator 16 which comprises the piezoelectric body (PZT film) 38 formed by sputtering in this way, when the lower electrode 36, which is disposed on the diaphragm 32 side of the piezoelectric body 38, is used as an individual electrode, it is possible to apply an electric field in the same direction as the direction of polarization of the piezoelectric body 38 by supplying a positive voltage to the lower electrode (individual electrode) 36. Therefore, unlike a case where the upper electrode 40 is used as the individual electrode, it is not necessary to supply a negative voltage to the upper electrode 40, and therefore the costs relating to the drive IC and power source can be reduced.

In the present embodiment, as shown in FIG. 1, the insulating layer 34 is disposed between the diaphragm 32 and the lower electrode (individual electrode) 36. A desirable mode is one where the insulating layer 34 is constituted by a silicon oxide film ($SiO_2$ film), a silicon carbonitride film (SiCN film), a zirconium oxide film ($ZrO_2$ film), or a silicon oxynitride film (SiON film). Of these, a particularly desirable mode is one where a silicon oxide film ($SiO_2$ film) obtained by thermal oxidation of a silicon substrate (diaphragm 32) is used as the insulating layer 34, since this is inexpensive and involves a simple process.

If no insulating layer 34 is provided between the diaphragm (Si substrate) 32 and the lower electrode 36, and the lower electrode 36 is taken as an individual electrode, then since the silicon (Si) which constitutes the diaphragm 32 is a semiconductor, current leakage may occur between the plurality of lower electrodes (individual electrodes) 36, via the diaphragm 32, and problems of electrical cross-talk and increased power consumption may arise.

On the other hand, in the present embodiment, the insulating layer 34 is provided between the diaphragm (Si substrate) 32 and the lower electrode (individual electrode) 36, as described above, and therefore it is possible to suppress current leakage between the plurality of lower electrodes 36, and the problems of electrical cross-talk and increased power consumption are prevented.

By means of this composition, when a positive drive voltage is applied from the drive IC (not illustrated) to the lower electrode (individual electrode) 36, in a state where the upper electrode (common electrode) 40 is earthed, then the diaphragm 32 deforms in a convex shape toward the pressure chamber 22 side, in accordance with the displacement of the piezoelectric body 38. In this case, since an electric field is applied in the same direction as the direction of polarization of the piezoelectric body 38, the amount of displacement of the piezoelectric body 38 is directly proportional to the intensity of the electric field. Due to the deformation of the diaphragm 32, the ink inside the pressure chamber 22 is pressurized via the etching stop layer 30 which is disposed on the lower surface side of the diaphragm 32, and an ink droplet is ejected from the nozzle 20 connected to the pressure chamber 22. After the ejection of ink, when the application of voltage to the lower electrode 36 is released, new ink is supplied from the common flow channel (not illustrated) to the pressure chamber 22 as the diaphragm 32 returns to its original state.

Next, the method of manufacturing an inkjet head 10 according to the present embodiment (which includes a method of manufacturing a piezoelectric actuator 16) will be described. FIGS. 2A to 2J are step diagrams showing one example of the method of manufacturing an inkjet head 10 according to the present embodiment.

Figure 2A:
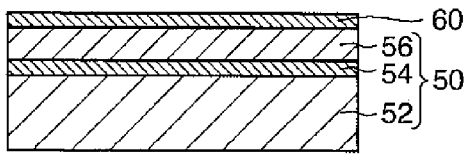
FIGS. 2A to 2J are step diagrams showing one example of a method of manufacturing an inkjet head.

Firstly, as shown in FIG. 2A, an SOI substrate 50 with a silicon oxide film ($SiO_2$ film) 60 formed on the front surface thereof is prepared. The SOI substrate 50 is a multiple-layer substrate which comprises a supporting layer made of silicon (Si layer) 52, a box layer made of a silicon oxide film ($SiO_2$ layer) 54, and an active layer (Si layer) 56 made of silicon. It is possible to form the silicon oxide film 60 on the front surface of the SOI substrate 50 by various different methods, such as thermal oxidation, sputtering, vacuum deposition, CVD (Chemical vapor deposition), and the like, and of these methods, it is particularly desirable to form the silicon oxide film 60 by means of thermal oxidation, since it is inexpensive and involves a simple process.

The supporting layer 52 of the SOI substrate 50 corresponds to the flow channel forming substrate 14 which is shown in FIG. 1. Similarly, the box layer 54 and the active layer 56 of the SOI substrate 50 correspond respectively to the etching stop layer 30 and the diaphragm 32, and the silicon oxide film 60 formed on the front surface of the SOI substrate 50 corresponds to the insulating layer 34.

The thicknesses of the respective layers which constitute the SOI substrate 50 are, for example, 1 µm of the box layer 54 (the etching stop layer 30), and 6 µm of the active layer 56 (diaphragm 32). Furthermore, the thickness of the oxide film 60 (insulating layer 34) is 1 µm. Moreover, the total thickness of the SOI substrate 50 including the oxide film of the active layer 60 is 525 µm.

Figure 2B:
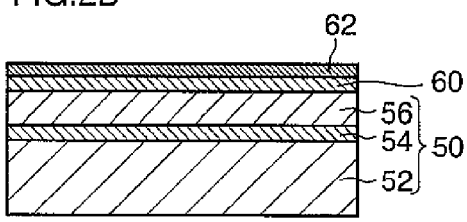

Next, as shown in FIG. 2B, a lower electrode layer 62 is formed on the upper surface of the silicon oxide film 60. In the present embodiment, a film of iridium (Ir) is formed as the lower electrode layer 62 by sputtering, but there are no particular restrictions on the material of the electrode, and it is also suitable to use another electrode material, such as gold, silver, copper, platinum, tungsten, or the like. Furthermore, there are no particular restrictions on the method of forming the lower electrode layer 62, and various different methods such as CVD, vacuum vapor deposition, and the like, can be adopted. The thickness of the lower electrode layer 62 formed in this step is 250 nm, for example.

Figure 2C:
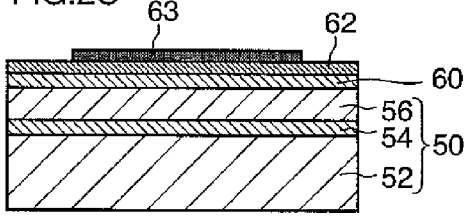

Subsequently, as shown in FIG. 2C, a resist 63 which is patterned to a prescribed shape is formed on the upper surface of the lower electrode layer 62. More specifically, a negative resist is applied onto the whole of the front surface of the lower electrode layer 62, pre-baking is carried out, and the resist is then exposed via a mask having an opening which corresponds to each lower electrode 36 (see FIG. 1), whereupon the material of the portion other than the exposed portion is removed by development and post-baking is then carried out. In this way, it is possible to obtain the patterned resist 63 on the lower electrode layer 62.

Figure 2D:
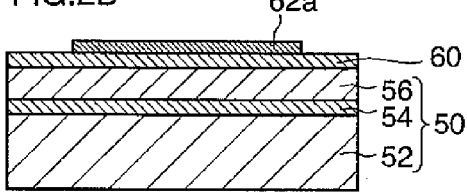

Then, dry etching is carried out on the lower electrode layer 62, using the resist 63 formed on the lower electrode layer 62 as a mask. By this means, the portion of the lower electrode layer 62 that is not covered by the resist 63 is removed, and as shown in FIG. 2D, it is possible to obtain a lower electrode layer 62a which is patterned at a position corresponding to each pressure chamber 22.

Figure 2E:
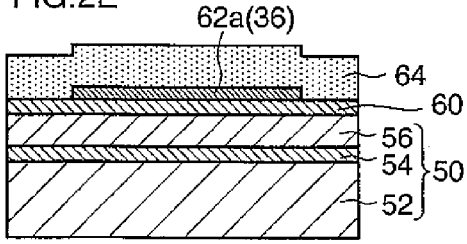
Figure 2F:
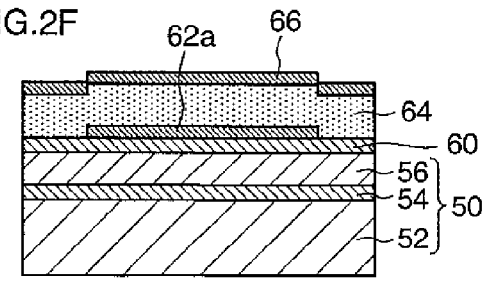

Thereupon, as shown in FIG. 2E, a piezoelectric layer 64 made of lead zirconate titanate (PZT) is deposited by sputtering on the upper surface of the silicon oxide film 60 (the surface on the side where the lower electrode layer 62a is formed). The thickness of the piezoelectric layer 64 formed in this process is 6 µm, for example, Thereupon, as shown in FIG. 2F, an upper electrode layer 66 is formed on the upper surface of the piezoelectric layer 64. Similarly to the lower electrode layer 62, the upper electrode layer 66 is not limited in particular in terms of the electrode material and the forming method used to compose the upper electrode layer 66. In the present example, the upper electrode layer 66 is formed by depositing a film of iridium (Ir) by sputtering. The thickness of the upper electrode layer 66 formed in this process is 250 nm, for example.

Figure 2G:
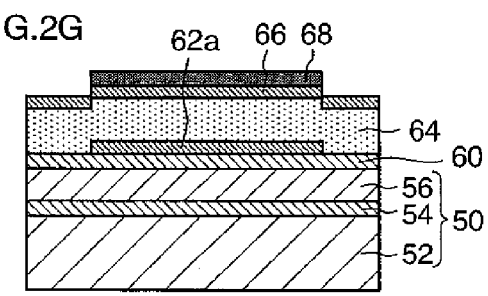

Subsequently, as shown in FIG. 2G, a resist 68 which is patterned to a prescribed shape is formed on the upper surface of the upper electrode layer 66. More specifically, similarly to the patterning method used for the resist 63, the steps of resist application, pre-baking, exposure, development and post-baking arc carried out sequentially, and thereby it is possible to obtain the patterned resist 68 on the upper electrode layer 66.

Figure 2H:
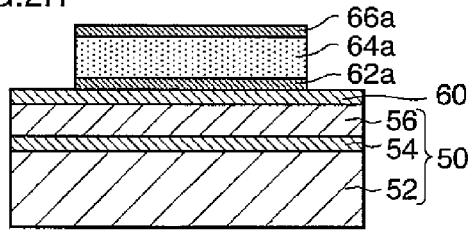

Thereupon, dry etching is carried out on the upper electrode layer 66 and the piezoelectric layer 64, using the resist 68 formed on the upper electrode layer 62 as a mask. In so doing, the portions of the upper electrode layer 66 and the piezoelectric layer 64 which are not covered by the resist 68 are removed, and as shown in FIG. 2H, similarly to the lower electrode layer 62a, a patterned upper electrode layer 66a and a piezoelectric layer 64a can be obtained at each of positions corresponding to the pressure chambers 22 (see FIG. 1).

Figure 2I:
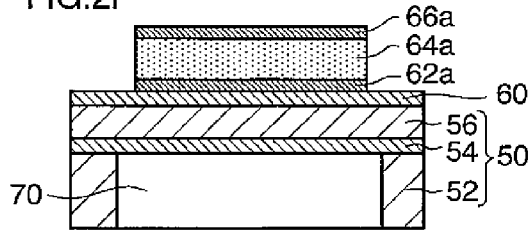
Figure 2J:
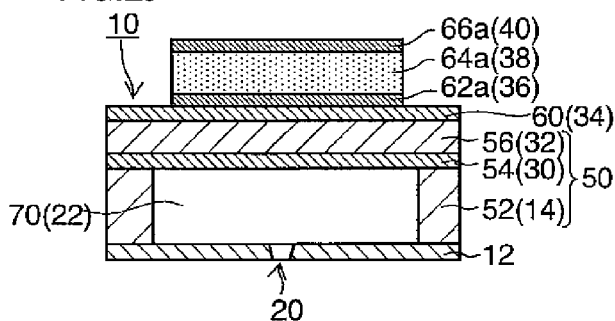

Thereupon, as shown in FIG. 2I, a recess section (groove section) 70 which opens on the lower surface side of the SOI substrate 50 is formed. More specifically, a recess section 70 is formed in the supporting layer 52 by wet etching, using the box layer 54 as an etching stop layer. The recess sections 70 formed in this step correspond to the pressure chambers 22.

Finally, the nozzle plate 12 is bonded to the lower surface side of the SOI substrate 50, so as to cover the openings of the recess sections 70, in a state where the nozzle plate 12 is aligned in position in such a manner that the nozzles 20 formed in the nozzle plate 12 connect with the recess sections 70 pressure chambers 22) formed in the supporting layer 52 of the SOI substrate 50. In this way, it is possible to obtain an inkjet head 10 according to the present embodiment.

Next, another desirable mode of the inkjet head 10 according to the present embodiment will be described in detail.

Regarding the piezoelectric actuators 16 provided in an inkjet head 10 according to the present embodiment, the insulating layer 34 is provided between the diaphragm (Si substrate) 32 and each lower electrode (individual electrode) 36, as described above, and consequently it is possible to suppress current leakage between the plurality of lower electrodes 36, and the problems of electrical cross-talk and increased power consumption can be prevented.

However, investigation carried out by the present inventor revealed that, if there is too great a difference between the thickness of the insulating layer ($SiO_2$ film) 34 disposed on the upper surface of the diaphragm 32 and the thickness of the etching stop layer ($SiO_2$ film) 30 which is disposed on the lower surface of the diaphragm 32, then the diaphragm 32 deforms due to the difference in the coefficient of linear expansion with respect to the silicon (Si) forming the diaphragm 32 (because the $SiO_2$ is formed at high temperature), and initial bending occurs in the diaphragm 32, leading on to problems such as decline in the amount of displacement of the piezoelectric actuators 16 and shortening of the lifespan. Moreover, there is also a problem in that it can lead to increased costs, and the like.

Therefore, the present inventor carried out an evaluation test using an inkjet head 10 obtained by means of the method of manufacture described above.

The conditions of the evaluation test were as follows: the thickness of diaphragm (Si substrate) 32 in FIG. 1 is 6 µm; the thickness of piezoelectric body (PZT film) 38 is 6 µm; the pressure chambers 22 have a square shape of edge length 300 µm. The reason that these values were employed is that in a high-resolution inkjet head of 1200 dpi or above, for example, the thickness of the diaphragm and the piezoelectric bodies is generally a thin dimension of 6 µm or less, and the pressure chambers are often small in size, with an edge length of 300 µm or less.

The evaluation was carried out with respect to the four items: "leakage current", "over-etching", "cost", and "amount of deformation of diaphragm".

The "leakage current" was evaluated as "OK" if less than 10 µA and as "NG" if equal to or greater than 10 µA. This is because, if the leakage current is equal to or greater than 10 µA, then an ink droplet is ejected from another nozzle, due to electrical cross-talk.

The "over-etching" was evaluated as "OK" if the thickness of the etching stop layer ($SiO_2$ film) 30 (box layer 54) was more than zero (0) after forming the pressure chambers 22 (recess section 70) by wet etching in the method of manufacture described above, and it was evaluated as "NG" if the diaphragm 32 was reduced by the over-etching process. If the thickness of the etching stop layer 30 is too thin, then the diaphragm (Si substrate) 32 is also etched away and differences in the thickness of the solid material of the diaphragm 32 will occur.

The "cost" was evaluated as "OK" if the heating time for forming the insulating layer (SiO$_2$ film) 34 by thermal oxidation on the upper surface of the diaphragm (Si substrate) 32 was less than 24 hours, and as "NG" if the heating time was 24 hours or longer. This is because if the furnace occupancy time is long, then the manufacturing costs increase.

The "amount of deformation of the diaphragm" was evaluated as "OK" if the initial bending of the diaphragm 32 was less than 100 nm, and as "NG" if the initial bending was 100 nm or more. This is because, if the initial bending of the diaphragm 32 is large, then due to the resulting stress, the diaphragm fractures and the durability of the diaphragm declines.

FIG. 3 shows the results of the evaluation test. Taking the thickness of the insulating layer (SiO$_2$ film) 34 to be A (μm), taking the thickness of the etching stop layer (SiO$_2$ film) 30 to be B (μm), and taking the thickness of the diaphragm (Si substrate) 32 to be C (μm), then as FIG. 3 reveals, desirable ranges for these values are ranges which satisfy the following expressions (1) to (3).

$$0.5 \leq A \leq 2 \qquad (1)$$

$$0.5 \leq B \leq 2 \qquad (2)$$

$$0.2 \leq (B/A) \leq 5 \qquad (3)$$

The thickness B of the etching stop layer 30 indicates a range which includes the dimensions before and after etching. More specifically, in expression (2), the lower limit is based on the dimension before etching and the upper limit is based on the dimension after etching. In other words, desirably, the thickness B of the etching stop layer 30 falls within the range indicated by expression (2), before and after etching.

By composing the thickness A (μm) of the insulating layer 34 and the thickness B (μm) of the etching stop layer 30, which are respectively formed on the upper and lower surfaces of the diaphragm (Si substrate) 32, so as to come within the ranges satisfying expressions (1) to (3), the electrical cross-talk and the power consumption can be reduced, the initial bending (internal stress) of the diaphragm 32 can be suppressed, and decline in the amount of displacement of the piezoelectric actuators 16 can be prevented.

Moreover, the present inventor performed an evaluation test similar to that described above, while altering the thickness of the diaphragm 32. FIGS. 4 to 7 show the corresponding results. The thickness of the diaphragm 32 is 1 μm in FIG. 4, 2 μm in FIG. 5, 15 μm in FIG. 6 and 20 μm in FIG. 7.

If the thickness of the diaphragm 32 is less than 2 μm, then there is a problem in that it is difficult to control accurately the thickness of the silicon oxide films (SiO$_2$ film) disposed on the upper and lower surfaces of the diaphragm 32, and since deformation of the diaphragm is liable to arise, then an evaluation of "NG" is given in this case.

On the other hand, as shown in FIG. 5 to FIG. 7, if the thickness of the diaphragm 32 is 2 μm, 15 μm or 20 μm, then provided that expression (1) to expression (3) are satisfied, it is possible to obtain similar beneficial effects to those in a case where the thickness of the diaphragm 32 described above was 6 μm (see FIG. 3). If the thickness of the diaphragm 32 is greater than 20 μm, then supposing the case of a piezoelectric body formed by sputtering, it is difficult to achieve a piezoelectric body of large thickness, and it is difficult to achieve an amount of displacement which enables ejection of ink.

Consequently, if the thickness of the diaphragm (Si substrate) 32 is C (μm), then it is more desirable to satisfy the following expression (4) in addition to satisfying expressions (1) to (3).

$$2 \leq C \leq 20 \qquad (4)$$

By adopting a composition which satisfies expressions (1) to (4) in this way, it is possible accurately to control the thickness of the silicon oxide films (SiO$_2$ film) which are disposed on the upper and lower surfaces of the diaphragm 32, and it is possible to obtain a sufficient amount of displacement in the piezoelectric actuators 16. Furthermore, it is possible to reduce the electrical cross-talk and power consumption, as well as suppressing the initial bending of the diaphragm 32 (in other words, suppressing the internal stress), and it is possible to prevent decline in the amount of displacement of the piezoelectric actuators 16.

Inkjet Recording Apparatus

Next, an inkjet recording apparatus which is one embodiment of the image forming apparatus relating to the present invention will be described.

Figure 8:
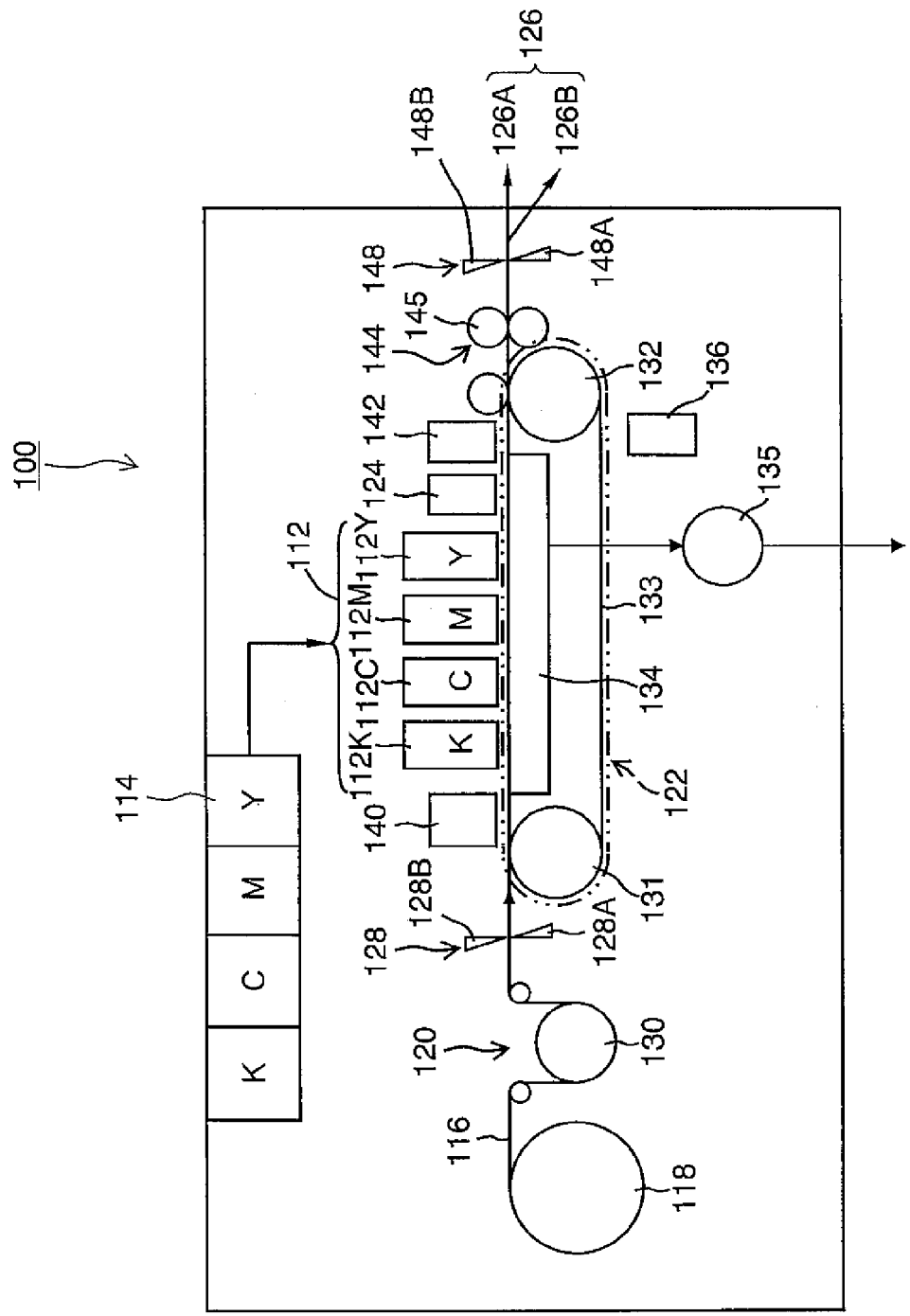
FIG. 8 is a general schematic drawing showing a general view of an inkjet recording apparatus.

FIG. 8 is a diagram of the general composition showing a general view of an inkjet recording apparatus. As shown in FIG. 8, the inkjet recording apparatus 100 comprises: a print unit 112 having a plurality of recording heads 112K, 112C, 112M, and 112Y for ink colors of black (K), cyan (C), magenta (M), and yellow (Y), respectively; an ink storing and loading unit 114 for storing inks of K, C, M and Y to be supplied to the recording heads 112K, 112C, 112M, and 112Y; a paper supply unit 118 for supplying recording paper 116; a decurling unit 120 for removing curl in the recording paper 116; a suction belt conveyance unit 122 disposed facing the nozzle face (ink-droplet ejection face) of the print unit 112, for conveying the recording paper 116 while keeping the recording paper 116 flat; a print determination unit 124 for reading the printed result produced by the print unit 112; and a paper output unit 126 for outputting image-printed recording paper (printed matter) to the exterior. The recording heads 112K, 112C, 112M, and 112Y correspond to the inkjet head 10 as shown in FIG. 1.

In FIG. 8, a magazine for rolled paper (continuous paper) is shown as an example of the paper supply unit 118; however, more magazines with paper differences such as paper width and quality may be jointly provided. Moreover, papers may be supplied with cassettes that contain cut papers loaded in layers and that are used jointly or in lieu of the magazine for rolled paper.

In the case of the configuration in which roll paper is used, a cutter 128 is provided as shown in FIG. 8, and the continuous paper is cut into a desired size by the cutter 128. The cutter 128 has a stationary blade 128A, whose length is not less than the width of the conveyor pathway of the recording paper 116, and a round blade 128B, which moves along the stationary blade 128A. The stationary blade 128A is disposed on the reverse side of the printed surface of the recording paper 116, and the round blade 128B is disposed on the printed surface side across the conveyor pathway. When cut papers are used, the cutter 128 is not required.

In the case of a configuration in which a plurality of types of recording paper can be used, it is preferable that an information recording medium such as a bar code or a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 116 delivered from the paper supply unit 118 retains curl due to having been loaded in the magazine. In order to remove the curl, heat is applied to the recording paper 116 in the decurling unit 120 by a heating drum 130 in the direction opposite from the curl direction in the magazine. The heating temperature at this time is preferably controlled so that the recording paper 116 has a curl in which the surface on which the print is to be made is slightly round outward.

The decurled and cut recording paper 116 is delivered to the suction belt conveyance unit 122. The suction belt conveyance unit 122 has a configuration in which an endless belt 133 is set around rollers 131 and 132 so that the portion of the endless belt 133 facing at least the nozzle face of the print unit 112 and the sensor face of the print determination unit 124 forms a plane.

The belt 133 has a width that is greater than the width of the recording paper 116, and a plurality of suction restrictors (not shown) are formed on the belt surface. A suction chamber 134 is disposed in a position facing the sensor surface of the print determination unit 124 and the nozzle surface of the print unit 112 on the interior side of the belt 133, which is set around the rollers 131 and 132, as shown in FIG. 8. The suction chamber 134 provides suction with a fan 135 to generate a negative pressure, and the recording paper 116 on the belt 133 is held by suction.

The belt 133 is driven in the clockwise direction in FIG. 8 by the motive force of a motor (not shown in) being transmitted to at least one of the rollers 131 and 132, which the belt 133 is set around, and the recording paper 116 held on the belt 133 is conveyed from left to right in FIG. 8.

Since ink adheres to the belt 133 when a marginless print job or the like is performed, a belt-cleaning unit 136 is disposed in a predetermined position (a suitable position outside the printing area) on the exterior side of the belt 133. Although the details of the configuration of the belt-cleaning unit 136 are not shown, examples thereof include a configuration in which the belt 133 is nipped with cleaning rollers such as a brush roller or a water absorbent roller, an air blow configuration in which clean air is blown onto the belt 133, and a combination of these. In the case of the configuration in which the belt 133 is nipped with the cleaning rollers, it is preferable to make the line velocity of the cleaning rollers different from that of the belt 133 to improve the cleaning effect.

The inkjet recording apparatus 100 can comprise a roller nip conveyance mechanism, in which the recording paper 116 is pinched and conveyed with nip rollers, instead of the suction belt conveyance unit 122. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 140 is disposed on the upstream side of the print unit 112 in the conveyance pathway formed by the suction belt conveyance unit 122. The heating fan 140 blows heated air onto the recording paper 116 to heat the recording paper 116 immediately before printing so that the ink deposited on the recording paper 116 dries more easily.

Figure 9:
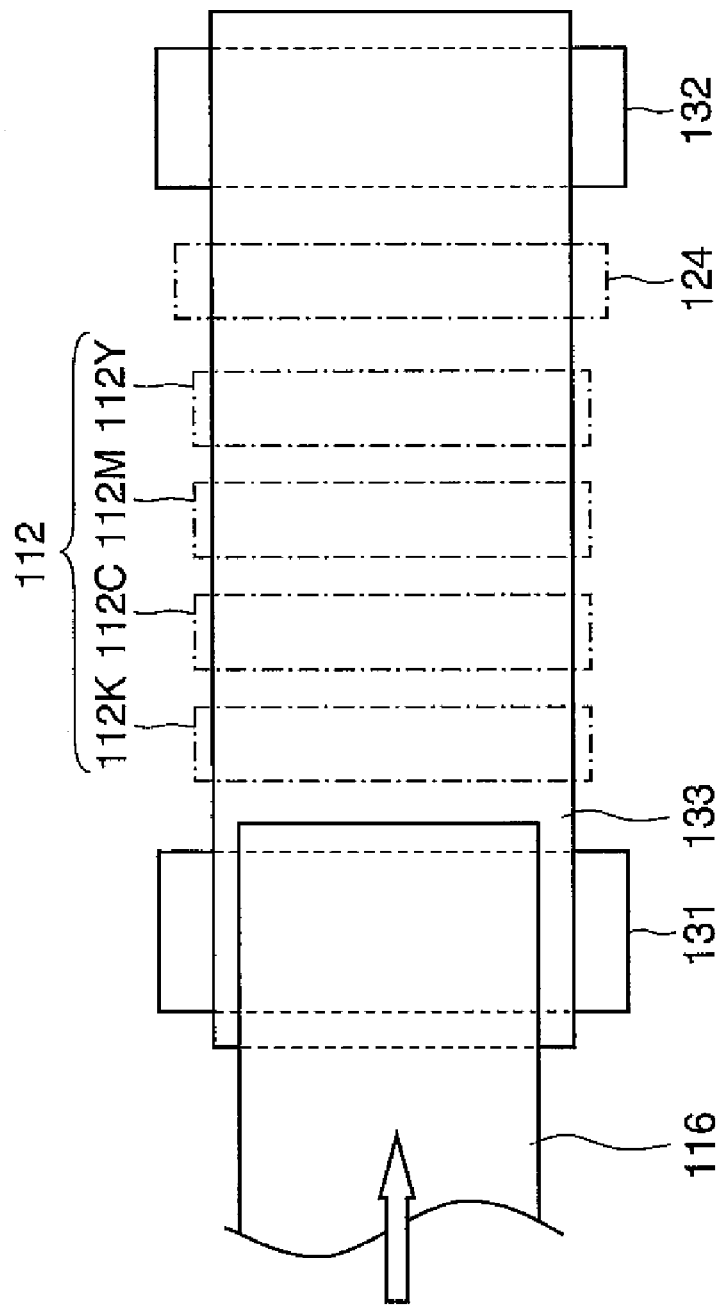
FIG. 9 is a principal plan diagram showing the peripheral area of a print unit of the inkjet recording apparatus.

The print unit 112 includes a so-called "full line head" in which a line head having a length corresponding to the maximum paper width is arranged in a direction (main scanning direction) that is perpendicular to the paper conveyance direction (sub-scanning direction). The recording heads 112K, 112C, 112M, and 112Y constituting the print unit 112, in which a plurality of ink ejection ports (nozzles) are arranged along a length that exceeds at least one side of the maximum-size recording paper 116 intended for use in the inkjet recording apparatus 100 (see FIG. 9).

The recording heads 112K, 112C, 112M, 112Y corresponding to respective ink colors are disposed in the order, black (K), cyan (C), magenta (M) and yellow (Y), from the upstream side (left-hand side in FIG. 8), following the direction of conveyance of the recording paper 116 (the paper conveyance direction). A color image can be formed on the recording paper 116 by ejecting inks of different colors from the recording heads 112K, 112C, 112M and 112Y, respectively, onto the recording paper 116 while the recording paper 116 is conveyed.

By adopting the print unit 112, in which the full line heads covering the full paper width are provided for the respective colors in this way, it is possible to record an image on the full surface of the recording paper 16 by performing just one operation of relatively moving the recording paper 116 and the print unit 112 in the paper conveyance direction (the sub-scanning direction), in other words, by means of a single sub-scanning action. Higher-speed printing is thereby made possible and productivity can be improved in comparison with a shuttle type head configuration in which a recording head reciprocates in the direction (the main scanning direction) perpendicular to the paper conveyance direction.

Although the configuration with the KCMY four standard colors is described in the present embodiment, combinations of the ink colors and the number of colors are not limited to those. Light inks and dark inks can be added as required. For example, a configuration is possible in which the recording heads for ejecting light-colored inks such as light cyan and light magenta are added.

As shown in FIG. 8, the ink storing and loading unit 114 has ink tanks for storing the inks of K, C, M and Y to be supplied to the heads 112K, 112C, 112M, and 112Y, and the tanks are connected to the heads 112K, 112C, 112M, and 112Y by means of prescribed channels. The ink storing and loading unit 114 has a warning device (for example, a display device or an alarm sound generator) for warning when the remaining amount of any ink is low, and has a mechanism for preventing loading errors among the colors.

The print determination unit 124 has an image sensor (line sensor, or the like) for capturing an image of the ink-droplet deposition result of the print unit 112, and functions as a device to check for ejection defects such as clogs of the nozzles in the print unit 112 from the ink-droplet deposition results evaluated by the image sensor.

The print determination unit 124 of the present embodiment is configured with at least a line sensor having rows of photoelectric transducing elements with a width that is greater than the ink-droplet ejection width (image recording width) of the recording heads 112K, 112C, 112M, and 112Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 124 reads a test pattern printed by the recording heads 112K, 112C, 112M, and 112Y of the respective colors, and performs ejection determination for each head. The ejection determination includes detection of the ejection, measurement of the dot size, and measurement of the dot formation position.

A post-drying unit 142 is disposed following the print determination unit 124. The post-drying unit 142 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substances that cause dye molecules to break down, and has the effect of increasing the durability of the print.

A heating/pressurizing unit 144 is disposed following the post-drying unit 142. The heating/pressurizing unit 144 is a device to control the glossiness of the image surface, and the image surface is pressed with a pressure roller 145 having a predetermined uneven surface shape while the image surface is heated, and the uneven shape is transferred to the image surface.

The printed matter generated in this manner is outputted from the paper output unit 126. The target print (i.e., the result of printing the target image) and the test print are preferably outputted separately. In the inkjet recording apparatus 100, a sorting device (not shown) is provided for switching the outputting pathways in order to sort the printed matter with the target print and the printed matter with the test print, and to send them to paper output units 126A and 126B, respectively. When the target print and the test print are simultaneously formed in parallel on the same large sheet of paper, the test print portion is cut and separated by a cutter (second cutter) 148. The cutter 148 is disposed directly before the paper output unlit 126, and is used for cutting the test print portion from the target print portion when a test print has been performed in the blank portion of the target print. The structure of the cutter 148 is the same as the first cutter 128 described above, and has a stationary blade 148A and a round blade 148B. Although not shown in FIG. 1, the paper output unit 126A for the target prints is provided with a sorter for collecting prints according to print orders.

Next, the structure of a print head will be described. The print heads 112K, 112C, 112M and 112Y of the respective ink colors have the same structure, and a reference numeral 150 is hereinafter designated to any of the print heads.

Figure 10A:
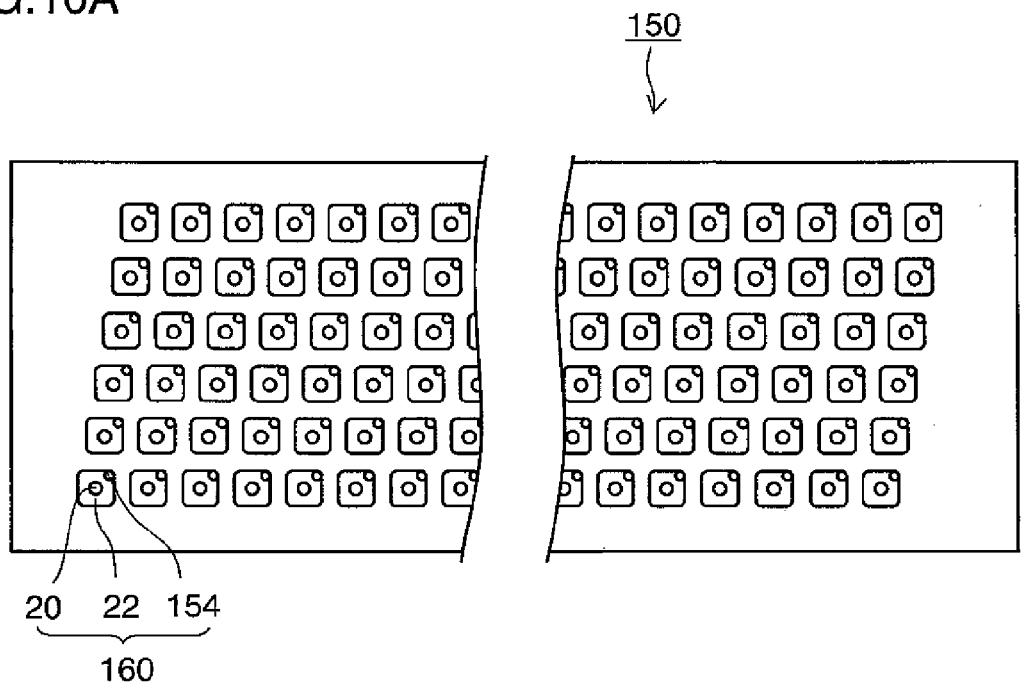
FIGS. 10A and 10B are plan view perspective diagrams showing examples of the composition of a recording head (inkjet head)

FIG. 10A is a perspective plan view showing an example of the configuration of the recording head 150. As shown in FIG. 10A, the recording head 150 according to the present embodiment has a structure in which a plurality of ink chamber units (droplet ejection elements that constitute recording element units corresponding to a nozzle) 160, each comprising a nozzle 20 forming an ink droplet ejection port, a pressure chamber 22 corresponding to the nozzle 20, and the like, are disposed two-dimensionally in the form of a staggered matrix, and hence the effective nozzle interval (the projected nozzle pitch) as projected in the lengthwise direction of the head (the direction perpendicular to the paper conveyance direction) is reduced and high nozzle density is achieved.

Figure 10B:
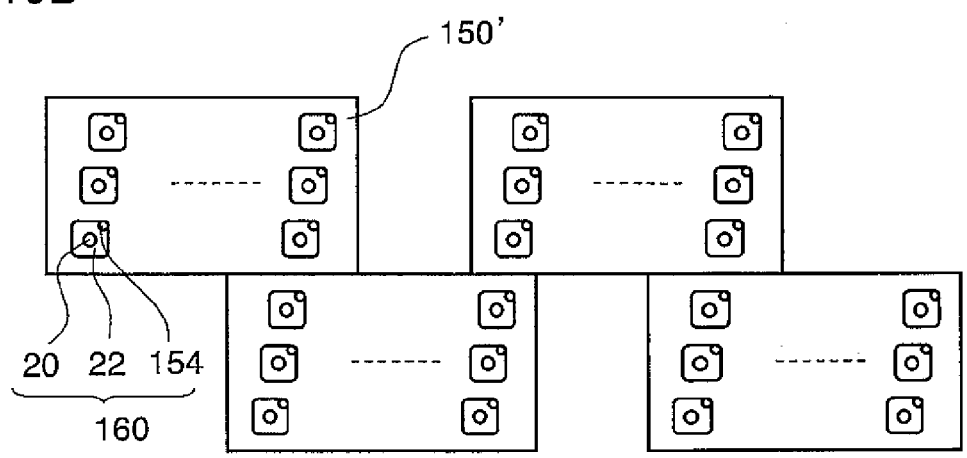

The mode of forming nozzle rows with at least a length corresponding to the entire width of the recording paper 116 in a direction (the main-scanning direction) substantially perpendicular to the conveyance direction (the sub-scanning direction) of the recording paper 116 is not limited to the example described above. For example, instead of the configuration in FIG. 10A, as shown in FIG. 10B, a line head having nozzle rows of a length corresponding to the entire width of the recording paper 116 can be lengthened by arranging and combining, in a staggered matrix, short head units 150' having a plurality of nozzles 20 arrayed in a two-dimensional fashion.

The pressure chambers 22 provided so as to correspond to the respective nozzles 20 have a substantially square planar shape. The nozzles 20 are disposed respectively in substantially the center portion of each pressure chamber 22, and an inlet port (supply port) 154 for the supplied ink is provided in a corner portion of each pressure chamber 22.

Furthermore, the shape of the pressure chambers 22 is not limited to that of the present example and various modes are possible in which the planar shape is a quadrilateral shape (diamond shape, rectangular shape, or the like), a pentagonal shape, a hexagonal shape, or other polygonal shape, or a circular shape, elliptical shape, or the like. Moreover, the arrangement of the nozzles 20 and the supply ports 154 is not limited to the arrangement shown in FIGS. 10A and 10B.

Next, the control system of the inkjet recording apparatus 100 will be described.

Figure 11:
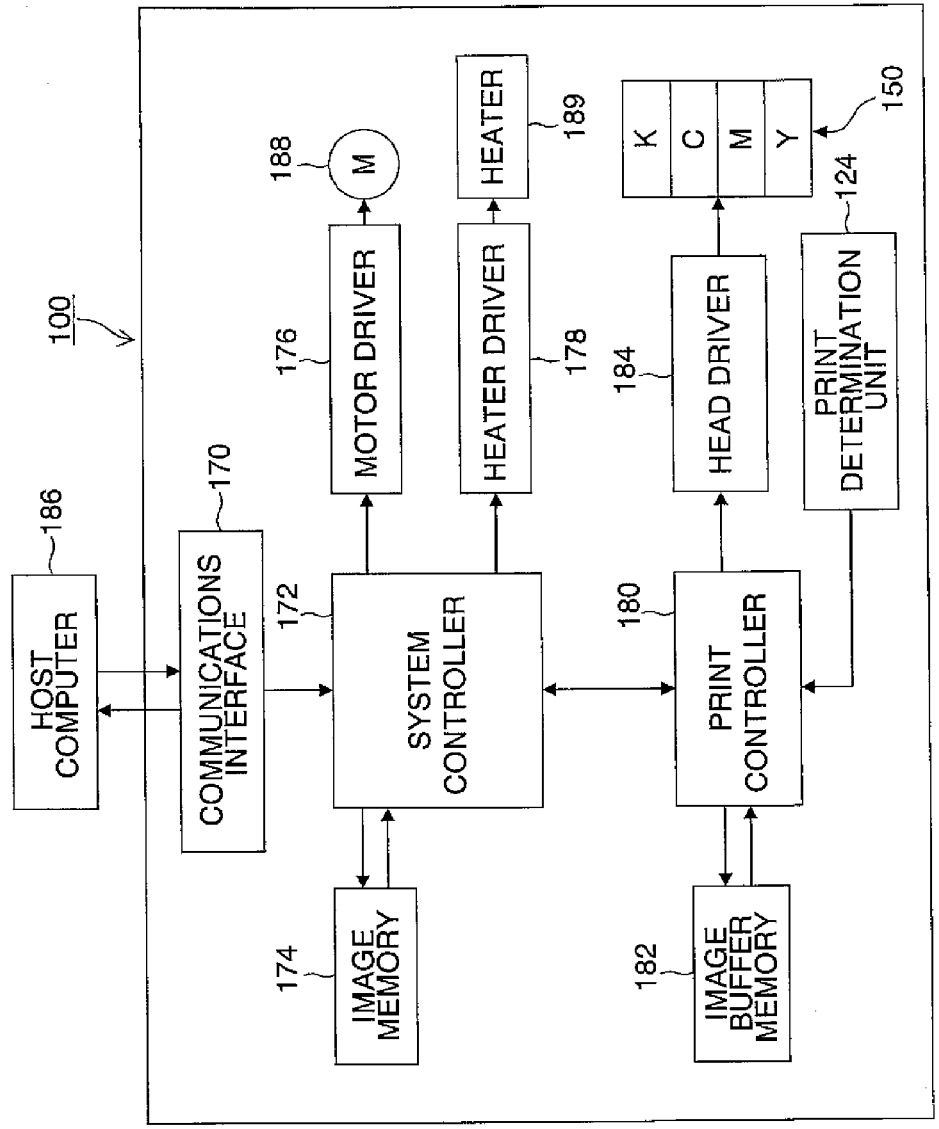
FIG. 11 is a principal block diagram showing the control system of the inkjet recording apparatus.
Figure 12:
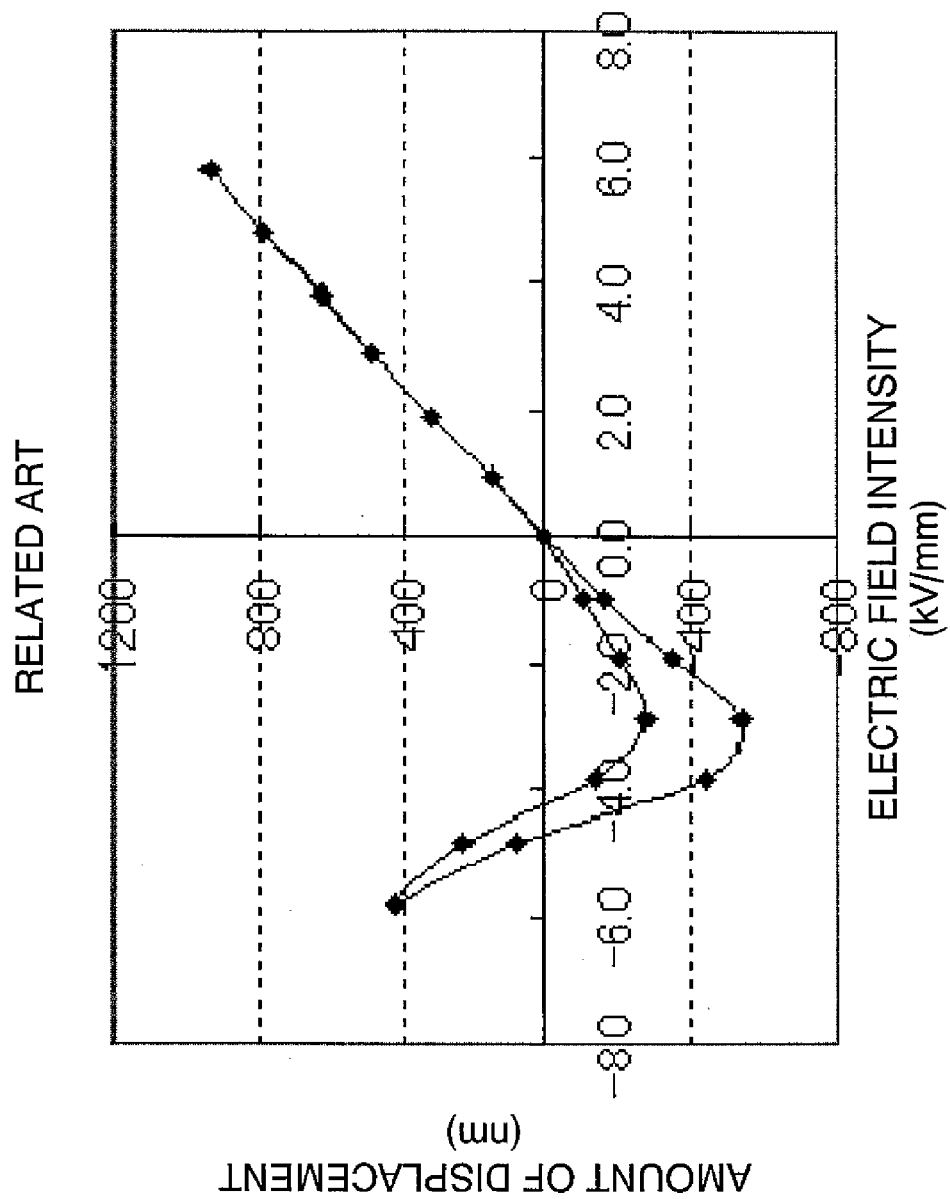
FIG. 12 shows the relationship between the applied electric field and the displacement of a PZT (lead zirconium titanate) film in the case where the PZT film is deposited by sputtering.

FIG. 11 is a principal block diagram showing the control system of the inkjet recording apparatus 100. The inkjet recording apparatus 100 comprises a communications interface 170, a system controller 172, an image memory 174, a motor driver 176, a heater driver 178, a print controller 180, an image buffer memory 182, a head driver 184, and the like.

The communications interface 170 is an interface unit for receiving image data sent from a host computer 186. A serial interface or a parallel interface may be used as the communications interface 170. A buffer memory (not shown) may be mounted in this portion in order to increase the communication speed.

The image data sent from the host computer 186 is received by the inkjet recording apparatus 100 through the communications interface 170, and is temporarily stored in the image memory 174. The image memory 174 is a storage device for temporarily storing images inputted through the communications interface 170, and data is written and read to and from the image memory 174 through the system controller 172. The image memory 174 is not limited to a memory composed of semiconductor elements, and a hard disk drive or another magnetic medium may be used.

The system controller 172 is a control unit for controlling the various sections, such as the communications interface 170, the image memory 174, the motor driver 176, the heater driver 178, and the like. The system controller 172 is constituted by a central processing unit (CPU) and peripheral circuits thereof, and the like, and in addition to controlling communications with the host computer 186 and controlling reading and writing from and to the image memory 174, and the like, it also generates control signals for controlling the motor 188 of the conveyance system and the heater 189.

The motor driver (drive circuit) 176 drives the motor 188 in accordance with commands from the system controller 172. The heater driver (drive circuit) 178 drives the heater 189 of the post-drying unit 142 or other units in accordance with commands from the system controller 172.

The print controller 180 has a signal processing function for performing various tasks, compensations, and other types of processing for generating print control signals from the image data stored in the image memory 174 in accordance with commands from the system controller 172 so as to supply the generated print control signals (dot data) to the head driver 184. Required signal processing is carried out in the print controller 180, and the ejection amount and the ejection timing of the ink droplets from the respective recording heads 150 are controlled via the head driver 184, on the basis of the print data. By this means, desired dot size and dot positions can be achieved.

The print controller 180 is provided with the image buffer memory 182; and image data, parameters, and other data are temporarily stored in the image buffer memory 182 when image data is processed in the print controller 180. The aspect shown in FIG. 11 is one in which the image buffer memory 182 accompanies the print controller 180; however, the image memory 174 may also serve as the image buffer memory 182. Also possible is an aspect in which the print controller 180 and the system controller 172 are integrated to form a single processor.

The head driver 184 generates drive signals for driving the piezoelectric actuators 16 (see FIG. 1) of the recording heads 150 of the respective colors, on the basis of the dot data supplied from the print controller 180, and supplies the generated drive signals to the piezoelectric actuators 16. The head driver 184 can be provided with a feedback control system for maintaining constant drive conditions for the recording heads 150.

The print determination unit 124 is a block that includes the line sensor as described above with reference to FIG. 8, reads the image printed on the recording paper 116, determines the print conditions (presence of the ejection, variation in the dot formation, and the like) by performing required signal processing, or the like, and provides the determination results of the print conditions to the print controller 180.

According to requirements, the print controller 180 makes various corrections with respect to the recording head 150 on the basis of the information obtained from the print determination unit 124.

Piezoelectric actuators, liquid ejection heads, image forming apparatuses, and methods of manufacturing a piezoelectric actuator according to embodiments of the present invention have been described in detail above, but the present invention is not limited to the aforementioned examples, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric actuator, comprising:
   a diaphragm made of silicon;
   an insulating layer formed on a front surface of the diaphragm;
   a plurality of individual electrodes formed on a surface of the insulating layer;
   a plurality of piezoelectric bodies formed respectively on surfaces of the plurality of individual electrodes; and
   a plurality of common electrodes which are respectively arranged across the plurality of piezoelectric bodies from the plurality of individual electrodes,
   wherein the plurality of piezoelectric bodies are polarized in a direction from the individual electrodes toward the plurality of common electrodes;
   the insulating layer formed on the front surface of the diaphragm is a first silicon oxide film;
   a second silicon oxide film is formed on a rear surface of the diaphragm; and
   taking a thickness of the first silicon oxide film to be A (μm), taking a thickness of the second silicon oxide film to be B (μm), and taking a thickness of the diaphragm to be C (μm), all of following conditions are satisfied:

$0.2 \leq A \leq 5$, $0.2 \leq B \leq 5$, $0.2 \leq (B/A) \leq 5$, and $2 \leq C \leq 20$.

2. A liquid ejection head comprising the piezoelectric actuator as defined in claim 1.

3. An image forming apparatus comprising the liquid ejection head as defined in claim 2.

4. A method of manufacturing a piezoelectric actuator, comprising the steps on
   forming a first silicon oxide film as an insulating layer on a front surface of a diaphragm made of silicon;
   forming a second silicon oxide film on a rear surface of the diaphragm;
   forming a plurality of individual electrodes on a surface of the insulating layer;
   forming a plurality of piezoelectric bodies by sputtering on surfaces of the plurality of individual electrodes; and
   forming a plurality of common electrodes which are respectively arranged across the plurality of piezoelectric bodies from the plurality of individual electrodes,
   wherein taking a thickness of the first silicon oxide film to be A (μm), taking a thickness of the second silicon oxide film to be B (μm), and taking a thickness of the diaphragm to be C (μm), all of following conditions are satisfied:

$0.2 \leq A \leq 5$, $0.2 \leq B \leq 5$, $0.2 \leq (B/A) \leq 5$, and $2 \leq C \leq 20$.

* * * * *